United States Patent
Ratzel

(10) Patent No.: US 7,123,090 B2
(45) Date of Patent: Oct. 17, 2006

(54) LOW-NOISE PREAMPLIFIER, IN PARTICULAR, FOR NUCLEAR MAGNETIC RESONANCE (NMR)

(75) Inventor: Dieter Ratzel, Rheinstetten (DE)

(73) Assignee: Bruker Biospin MRI GmbH, Ettlingen (DE)

(*) Notice: Subject to any disclaimer, the term of this patent is extended or adjusted under 35 U.S.C. 154(b) by 82 days.

(21) Appl. No.: 10/844,364

(22) Filed: May 13, 2004

(65) Prior Publication Data

US 2005/0001680 A1    Jan. 6, 2005

(30) Foreign Application Priority Data

Jun. 6, 2003   (DE) ................ 103 25 634

(51) Int. Cl.
*H03F 1/36* (2006.01)
(52) U.S. Cl. .......................... 330/165; 330/79
(58) Field of Classification Search ............. 330/165, 330/195, 294, 302, 79
See application file for complete search history.

(56) References Cited

U.S. PATENT DOCUMENTS

| 3,621,378 A | * | 11/1971 | Kleiman et al. ............ 324/315 |
| 4,774,477 A | * | 9/1988 | Rodes et al. ................ 330/277 |
| 5,545,999 A | | 8/1996 | Mueller |
| 6,172,563 B1 | | 1/2001 | Trask |
| 6,177,796 B1 | | 1/2001 | Viti |

FOREIGN PATENT DOCUMENTS

| EP | 0591032 A1 * | 4/1994 |
| GB | 15 90 647 | 6/1981 |
| GE | 31 35 854 | 4/1983 |

OTHER PUBLICATIONS

Preamplifier Circuit Diagram NMR Spectrometer CXP 100, Bruker, 1980.
Tucker, D.G., "The History of Positive Feedback", Radio and Electronic Engineer, vol. 42, No. 2, Feb. 1972, p. 74.

* cited by examiner

Primary Examiner—Steven J. Mottola
(74) Attorney, Agent, or Firm—Paul Vincent

(57) ABSTRACT

A low-noise preamplifier with an electronic amplifying element having an input (2) and an output (4), and with a first transformer (6) having a primary winding (5) and a secondary winding (8) is characterized in that the input (2) of the electronic amplifying element is the base of a transistor, the gate (G) of a field effect transistor (FET) or the grid of a vacuum tube, and the output (4) of the electronic amplifying element is the collector, the drain (D) or the anode, the output current ($I_p$) being passed from the electronic amplifying element through the primary winding (5) of the first transformer (6) to the output (7) of the preamplifier, wherein the secondary winding (8) of the first transformer (6) is connected to the input (2) of the electronic amplifying element. This preamplifier can be operated with extremely low noise and at any input impedance, in particular, at 50 ohms or 75 ohms.

14 Claims, 3 Drawing Sheets

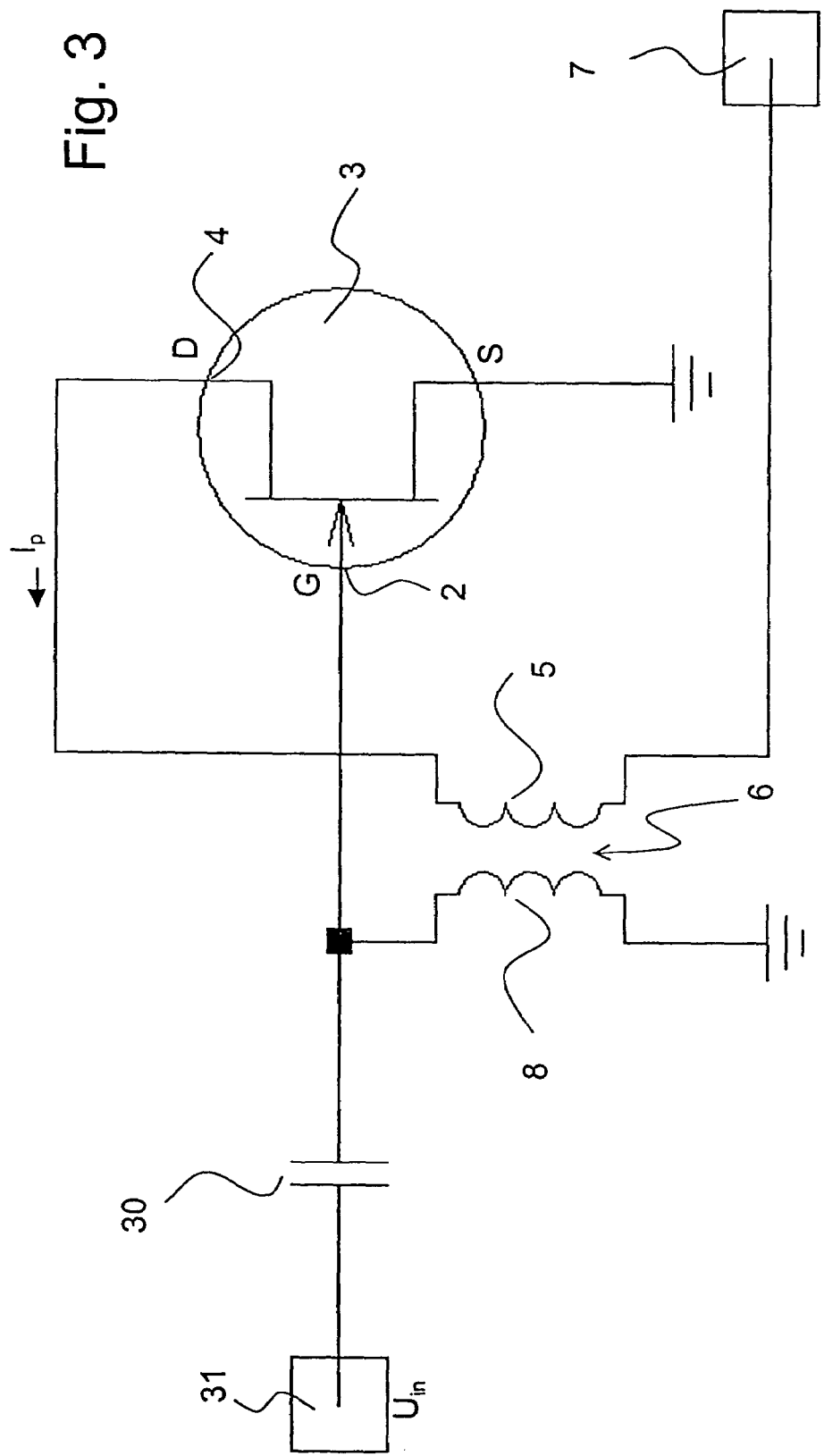

LOW-NOISE PREAMPLIFIER, IN PARTICULAR, FOR NUCLEAR MAGNETIC RESONANCE (NMR)

This application claims Paris Convention priority of DE 103 25 634.2 filed Jun. 6, 2003 the complete disclosure of which is hereby incorporated by reference.

BACKGROUND OF THE INVENTION

The invention concerns a low-noise preamplifier with an electronic amplifying element having an input and an output, and with a first transformer having a primary winding and a secondary winding.

A preamplifier of this type has been disclosed by the circuit diagram of a preamplifier in NMR spectrometer CXP 100 of the company Bruker in 1980.

Preamplifiers are used in all electronic fields to amplify signals, in particular currents, to a level suited for a downstream connected electronic component. One fundamentally tries to keep the signal-to-noise ratio large during the amplifying process. The quality factor thereby used is the so-called noise factor.

For the amplification of alternating current signals, the input impedance of the preamplifier must also be taken into consideration. Standardized input impedances of 50 ohms or 75 ohms are usually desired to eliminate reflections, signal losses and resonance detunings e.g. from signal sources.

The conventional preamplifier arrangements normally utilize transistors in the emitter circuit configuration. When GASFETs (gallium arsenide based field effect transistors) are used, very good noise factors in the range of 0.3 dB can be obtained for a narrow frequency range. However, the input resistance of the GASFET preamplifier arrangement is complex, having a real portion of only 1 to 3 ohms. In other preamplifiers which can be used in a broadband range, defined input impedances of e.g. 50 ohms can be established, however, the noise factors which can be obtained are quite high, i.e. approximately 1.2 dB. To adjust the input impedance, a so-called $\lambda/4$ transformation (preamplifier decoupling) can be effected. Also known in the art are low-noise preamplifier arrangements having high input impedances in the kohm range.

The circuit diagram of the CXP 100 discloses a preamplifier having the input signal of the preamplifier connected to the emitter of a transistor via the secondary winding of a transformer. The transistor base is capacitively connected to ground, and the collector of the transistor is connected to a direct voltage source via the primary winding of the transformer. The output signal of the preamplifier is tapped from the primary winding of the transformer.

In contrast thereto, it is the object of the present invention to provide a preamplifier with extremely low noise which can be operated at basically any input impedance, in particular, at 50 or 75 ohms.

SUMMARY OF THE INVENTION

This object is achieved in accordance with the invention with a preamplifier arrangement of the above-mentioned type in that the input of the electronic amplifying element is the base of a transistor, the gate of a field effect transistor (FET) or the grid of a vacuum tube, and the output of the electronic amplifying element is the collector, the drain or the anode, the output current being guided from the electronic amplifying element through the primary winding of the first transformer to the output of the preamplifier, wherein the secondary winding of the first transformer is connected to the input of the electronic amplifying element.

The principle of operation of the circuit is based on the fact that the first transformer maps part of the output current, with proper phase, to the input of the preamplifier and to the amplifying element thereby changing, in particular reducing, the input impedance of the preamplifier. The inventive circuit permits free selection of the input resistance of the inventive preamplifier via the first transformer. Due to the high-ohmic input of the amplifying element, there is a substantial current flow between the input of the preamplifier and ground only via the secondary winding of the first transformer. The current flow through the secondary winding of the first transformer is determined by the induction acting in this secondary winding. The current induced in the secondary winding can thereby be adjusted via the winding ratio in the first transformer. In this manner, the input impedance of the preamplifier can be selected, in accordance with Ohm's law, through suitable selection of the winding ratio of the first transformer.

To provide simultaneous low-noise operation of the inventive preamplifier, the amplifying element must only be selected such that its noise optimum is the source impedance at the set input impedance. If no such amplifying elements are available, compensation is possible through suitable additional circuits on the input side of the preamplifier (see embodiments below). The inventive preamplifier is preferably used with conventional transistors with high input impedances of 130 ohms or more, high steepness and low noise factor. HEMT transistors and GASFETs can, in particular, be used in the present invention.

The inventive setting of the input impedance is not achieved via counter couplings on the basis of high ohmic loss, rather on low-loss transformer counter coupling, thereby preventing deterioration of the noise factor due to the counter coupling.

One embodiment of the inventive preamplifier is advantageous, wherein the low-noise preamplifier is part of a radio frequency (RF) detection system of a nuclear magnetic resonance (NMR) apparatus. An NMR apparatus permits utilization of a good signal-to-noise ratio for measurements with particularly high resolution.

In a particularly preferred embodiment, the input impedance can be preselected between $50\Omega$ and $75\Omega$, preferably to $50\Omega$ or to $75\Omega$, which permits use of the preamplifier with standardized lines and components.

In one further preferred embodiment of the inventive preamplifier, the preamplifier can be operated between 1 MHz and 1 GHz. This is the frequency range which is typically relevant for NMR measurements.

In a preferred further development of this embodiment, the preamplifier is designed to be broad-banded up to a frequency of 400 MHz. In this case, tuning procedures in the frequency range of 1 MHz to 400 Mhz are largely unnecessary, which facilitates servicing.

In an alternative, also preferred further development, the preamplifier is designed to be narrow-banded in a preselectable frequency between 400 MHz and 1 GHz. This narrow-band tuning reduces interfering frequencies.

In one particularly preferred embodiment of the inventive preamplifier, the electronic amplifying element is selected to operate at a noise factor $<\frac{1}{2}$ dB, preferably $\leq 0.4$ dB. In particular, in association with an input impedance of 50 ohms or 75 ohms, such noise factors can be realized only with the inventive teaching and permits particularly good utilization of the advantages of the invention.

In one further preferred embodiment, the setting of the winding ratio of the first transformer leads to a reflection factor for the input signal of the preamplifier which is better than −20 dB. The termination of the signal line arriving at the preamplifier is adjusted to the impedance of the signal line with maximum accuracy thereby reducing reflections at the end of the signal line. The low reflections lead to particularly good useful signal strength.

An advantageous embodiment is characterized in that a transistor with a noise optimum at $R_{opt} < 200\Omega$ is selected as an electronic amplifying element, wherein $R_{opt}$ is the connecting resistance at minimum transistor noise. In this case, $R_{opt}$ is in the vicinity of the typically desired input impedances of the inventive preamplifier. The electronics of the preamplifier can thereby be kept simple. In particular, the winding ratios of an optional second transformer are close to 1 and the second transformer may be of simple construction.

In an advantageous further development of this embodiment, $R_{opt} = 50\Omega$ or $R_{opt} = 75\Omega$. In this case, the inventive preamplifier can be operated at optimum noise by means of the first transformer alone and at an input impedance selected by the winding ratio of the first transformer. Optimization to the $R_{opt}$ value of the transistor is thereby unnecessary.

In a preferred embodiment of the inventive preamplifier, a second transformer is connected upstream of the electronic amplifying element to optimise the noise factor largely independently of the impedance adjustment. This permits operation of the amplifying element at its noise optimum. The second transformer can thereby ensure noise optimisation over a wide broadband frequency range of up to approximately 200–400 MHz.

In accordance with the invention, the noise optimum of the amplifying element is initially detected by the second transformer, and the input impedance of the preamplifier is then adjusted to the desired value through the first transformer while thereby maintaining the noise optimum in an unexpected fashion.

In an alternative, also preferred embodiment of the inventive preamplifier, a capacitor having a capacitance C is connected upstream of the electronic amplifying element to optimise the noise factor largely independently of the impedance adjustment, the capacitor C cooperating with the inductance L of the secondary winding of the first transformer to minimize the noise factor for a predetermined frequency, via the L/C ratio. The amplifying element can thereby be operated at its noise optimum and the predetermined frequency may also be above 400 MHz. A frequency range is thereby accessible which cannot be accessed with the broadband, second transformer. In accordance with the invention, the noise factor is first optimised via the L/C ratio, and the input impedance of the preamplifier is then adjusted through the first transformer, thereby maintaining the noise optimum.

Further advantages of the invention can be extracted from the description and the drawing. The features mentioned above and below may be used in accordance with the invention either individually or collectively in arbitrary combination. The embodiments shown and described are not to be understood as exhaustive enumeration but have exemplary character for describing the invention.

The invention is shown in the drawing and is explained in more detail with reference to embodiments.

BRIEF DESCRIPTION OF THE DRAWING

FIG. 3 shows the circuit diagram of an embodiment of an inventive preamplifier with an upstream capacitor at the input of the preamplifier.

DESCRIPTION OF THE PREFERRED EMBODIMENT

Figure 1:
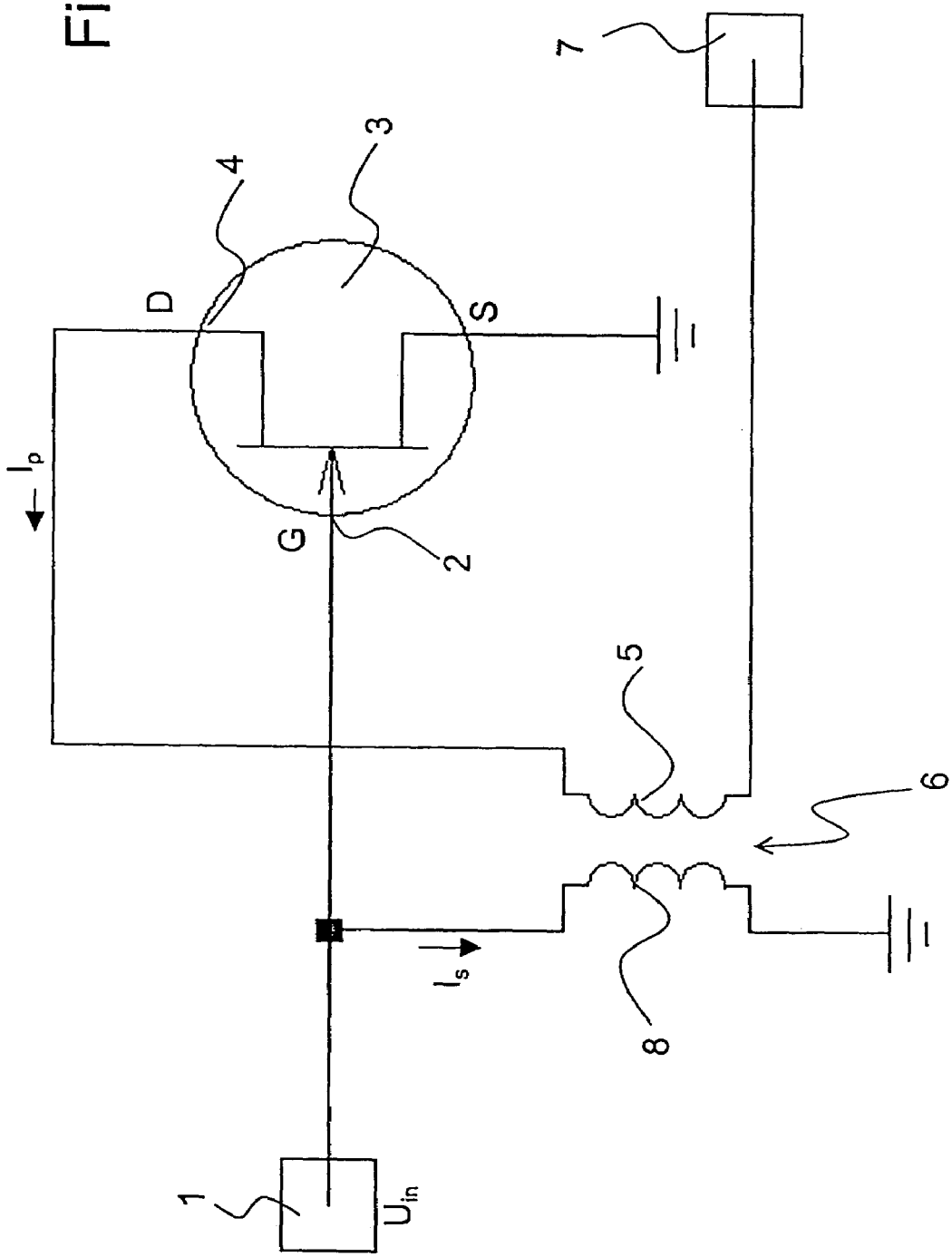
FIG. 1 shows the circuit diagram of an embodiment of an inventive preamplifier without the direct current circuit portion.

FIG. 1 shows a circuit diagram of a simple embodiment of the inventive preamplifier. This circuit is mainly suited for low frequencies below 100 MHz. An input voltage $U_{in}$ is applied at an input 1 of the preamplifier. The input 1 of the preamplifier is connected to an input 2 of an amplifying element, namely gate G of a field effect transistor (FET) 3. The source S of the FET is connected to ground. The drain D of the FET 3 forms the output 4 of the amplifying element. The signal at the output 4 of the amplifying element is passed through a primary coil 5 of a first transformer 6 and applied to an output 7 of the preamplifier. A primary current $I_p$ flows in the current line between the output 4 of the amplifying element and the output 7 of the preamplifier.

The first transformer 6 also has a secondary coil 8. One end thereof is connected to ground and the other end is connected to the input 1 of the preamplifier and to the input 2 of the amplifying element. A secondary current $I_s$ is induced in the secondary coil 8 by the primary current $I_p$.

The voltage $U_{in}$ at the gate G generates a primary current $I_p$ according to $I_p = S*U_{in}$ at the drain D, wherein S is the steepness of the FET 3 in amperes/volts. The primary current $I_p$ generates a secondary current $I_s$ through induction in accordance with $I_s = I_p*U_{in}*n1$, with n1 being the winding ratio between the primary coil 5 and secondary coil 8, i.e. $n1 = N_{p1}/N_{s1}$ with $N_{p1}$ being the winding number of the primary coil 5 and $N_{s1}$ being the winding number of the secondary coil 8.

The gate G of the FET is high-ohmic compared to the secondary coil 8 such that the only substantial current flow at the input 1 of the preamplifier is the secondary current $I_s$. In accordance with Ohm's law, the input resistance $R_{in}$ of the preamplifier $R_{in} = U_{in}/I_s = 1/(n1*S)$. In this fashion, the input impedance $R_{in}$ of the preamplifier can be determined for a given steepness S of FET 3, via the winding ratio n1.

In this embodiment, the adjusted input impedance $R_{in}$ of the preamplifier and the source impedance which the FET 3 experiences at its input 2, are identical. It is therefore advantageous in this embodiment, when the adjusted input impedance $R_{in}$ and the noise-optimised source impedance $R_{opt}$ of the FET 3 are identical.

A direct voltage source applies a positive voltage to the drain D. (not shown in FIG. 1)

Figure 2:
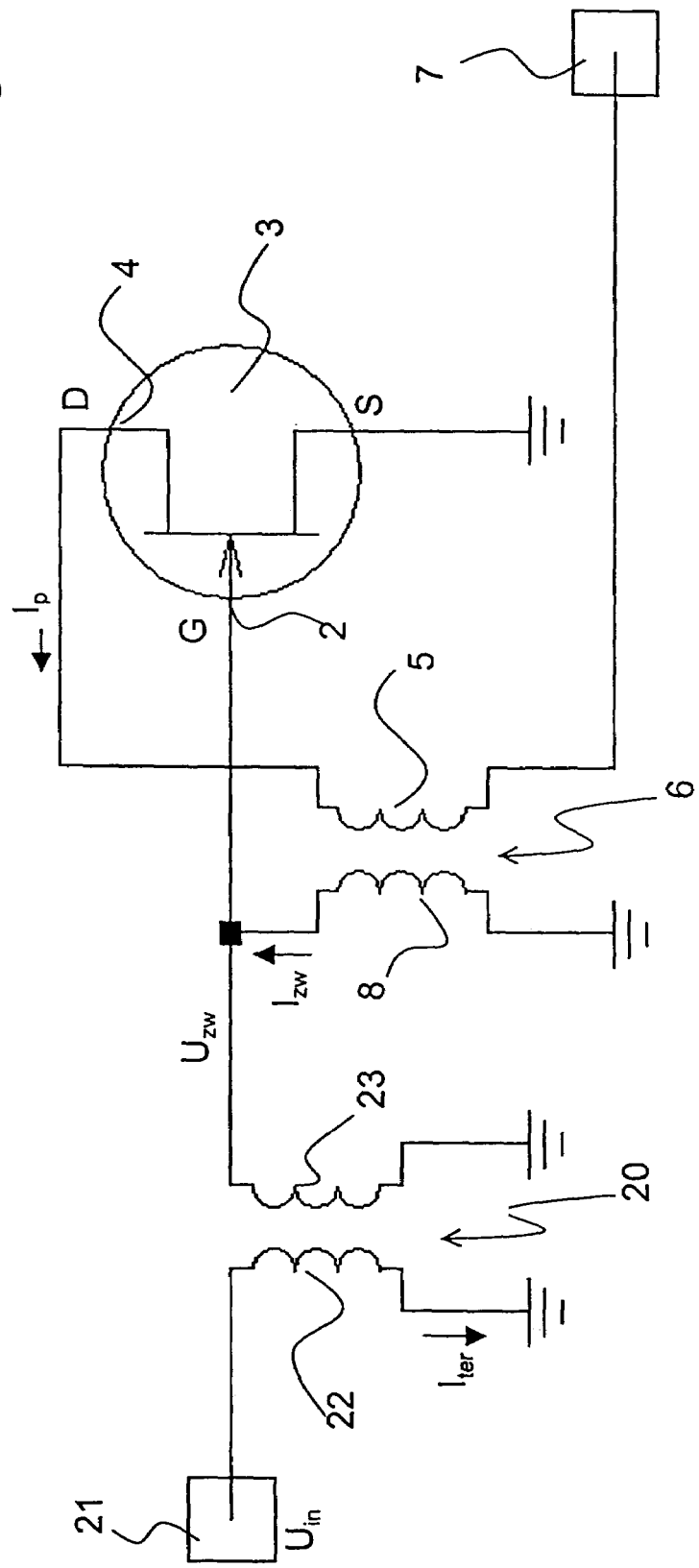
FIG. 2 shows the circuit diagram of an embodiment of an inventive preamplifier with an upstream second transformer at the input of the preamplifier.

FIG. 2 shows another embodiment of the inventive preamplifier similar to FIG. 1 but with an additional second transformer 20.

If the desired input impedance $R_{in}$ of the preamplifier is different from the given $R_{opt}$ value of the amplifying element (in particular of the FET of FIG. 1), the second transformer 20 together with the first transformer 6 can be used to adjust the desired input impedance $R_{in}$ at an input 21 of the preamplifier while nevertheless operating the amplifying element at $R_{opt}$. The second transformer 20 thereby provides an additional degree of freedom for the circuit. The second transformer 20 transforms $R_{in}$ at the input 21 of the preamplifier to $R_{opt}$ at the input 2 of the amplifying element.

The input 21 of the preamplifier is connected to a primary coil 22 of the second transformer 20. The other end of the primary coil 22 is connected to ground. The second transformer has a secondary coil 23, one end of which is also connected to ground. The other end of the secondary coil 23 is connected to the gate G of the FET 3. The gate G is also connected to the secondary winding 8 of the first transformer 6. The output current of the FET 3 passes, as primary current $I_p$, through the primary coil 5 of the first transformer 6 and is fed to the output 7 of the preamplifier.

The two transformers 6, 20 cooperate to adjust the source resistance seen by the gate G of the FET 3 as well as the input impedance $R_{in}$ of the preamplifier. The source resistance is thereby set to $R_{opt}$.

The voltage $U_{in}$ applied at the input 21 of the preamplifier is transformed to a value $U_{zw}$ by the second transformer 20. This voltage $U_{zw}$ determines the primary current $I_p$. Via the first transformer 6, the primary current $I_p$ generates an intermediate current $I_{zw}$ in the secondary coil 8 of the first transformer 6. This intermediate current $I_{zw}$ generates a tertiary current $I_{ter}$ through the second transformer 20 in the secondary coil 22 of the second transformer 20. $U_{in}$ and $I_{ter}$ define the input resistance $R_{in}$ of the preamplifier.

In accordance with the invention, the noise optimum of the FET 3 is preferably initially adjusted through suitable selection of the winding ratio n2 of the second transformer 22. Towards this end, auxiliary devices such as a network analyser ("wobbler") can be used. Subsequently, the winding ratio n1 of the first transformer is adjusted to obtain the desired input impedance $R_{in}$ of the preamplifier. Auxiliary devices may also be used in this case. It has surprisingly turned out that a change of the winding number n1 of the first transformer 6 does not change the noise factor of the circuit. Independent adjustment of noise optimisation and input impedance $R_{in}$ is thereby possible with the inventive teaching.

FIG. 3 shows a further embodiment of an inventive preamplifier. This embodiment is similar to the embodiment of FIG. 1, wherein an additional capacitor 30 is disposed between an input 31 of the preamplifier and the secondary coil 8 of the first transformer 6. The capacitor 30 has the capacitance C and the secondary coil 8 has an inductance L.

The LC combination of capacitor 30 and secondary coil 8 serves a similar function as the second transformer in FIG. 2. Utilization of the resonance behavior of this LC oscillating circuit permits control of the current flow in the region of the input 31 of the preamplifier.

The LC combination generates an upward transformation of the preselected input impedance $R_{in}$ to the $R_{opt}$ value of the FET 3. The required transformation ratio in the first transformer 6 can be adjusted via the coupling factor between the primary coil 5 and the secondary coil 8.

The noise optimum $R_{opt}$ of the FET 3 is preferably selected via a suitable L/C ratio. The optimum L and C thereby depend on the frequency of the signal at the input 31. The input impedance $R_{in}$ is then set via the first transformer 6.

The use of an LC combination instead of a second transformer is recommended, in particular, for higher frequencies above approximately 200 MHz since the properties of a (second) transformer deteriorate at higher frequencies and the reactive portion of $R_{opt}$ increases such that the noise optimum can no longer be reached with a second transformer.

I claim:

1. A low-noise preamplifier comprising:
a preamplifier input;
an electronic amplifying element having an element input which is one of a transistor base, a field effect transistor gate, and a vacuum tube grid, said amplifying element also having an element output which is one of a collector, a drain and an anode, said amplifying element output generating an output current;
means for connecting said preamplifier input to said element input, without interposition of any inductive components; and
a first transformer having a primary winding and a secondary winding, wherein said output current is passed from said amplifying element output through said primary winding of said first transformer and further to an amplifier output, wherein said secondary winding of said first transformer is connected between said element input of said electronic amplifying element and ground.

2. The preamplifier of claim 1, wherein the low-noise preamplifier is designed, structured, and dimensioned as part of a radio frequency detection system of a nuclear magnetic resonance apparatus.

3. The preamplifier of claim 1, wherein said element input has an input impedance which can be preselected between 50Ω and 75Ω.

4. The preamplifier of claim 3, wherein said input impedance is one of 50Ω and 75Ω.

5. The preamplifier of claim 1, wherein the preamplifier can be operated between 1 MHz and 1 GHz.

6. The preamplifier of claim 5, wherein the preamplifier is designed to be broad banded up to a frequency of 400 MHz.

7. The preamplifier of claim 5, wherein the preamplifier is designed to be narrow banded for a preselectable frequency between 400 MHz and 1 GHz.

8. The preamplifier of claim 1, wherein said electronic amplifying element is selected to operate at a noise factor of <½ dB.

9. The preamplifier of claim 8, wherein said noise factor is ≦0.4 dB.

10. The preamplifier of claim 1, wherein the preamplifier has a signal input reflection factor of better than −20 dB, which is obtained through adjustment of a winding ratio of said first transformer.

11. The preamplifier of claim 1, wherein said amplifying element is selected to have a noise optimum resistance of <200Ω, said noise optimum resistance being a connecting resistance at which noise of said amplifying element is at a minimum.

12. The preamplifier of claim 11, wherein said noise optimum resistance is one of 50Ω and 75Ω.

13. The preamplifier of claim 1, further comprising a second transformer connected upstream of said electronic amplifying element for optimising a noise factor largely independently of an impedance adjustment.

14. The preamplifier of claim 1, further comprising a capacitor having a capacitance C, said capacitor being connected upstream of said electronic amplifying element for optimising a noise factor largely independently of an impedance adjustment through cooperation with an inductance L of said secondary winding of said first transformer to minimize said noise factor at a predetermined frequency via an L/C ratio.

* * * * *